US012809340B2

(12) United States Patent
Kusayanagi et al.

(10) Patent No.: US 12,809,340 B2
(45) Date of Patent: Nov. 24, 2026

(54) CONTROL APPARATUS, ADJUSTING METHOD THEREOF, LITHOGRAPHY APPARATUS, AND ARTICLE MANUFACTURING METHOD THAT IMPROVE POSITIONAL ACCURACY OF AN OBJECT

(71) Applicant: CANON KABUSHIKI KAISHA, Tokyo (JP)

(72) Inventors: Hirokazu Kusayanagi, Tochigi (JP); Tomoyasu Hata, Tochigi (JP); Yuya Inomata, Tochigi (JP); Yasunobu Asakura, Tochigi (JP); Takumi Hashimoto, Saitama (JP); Hiroshi Morikawa, Tochigi (JP); Masahiro Ito, Tochigi (JP); Yuji Ishii, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 520 days.

(21) Appl. No.: 18/162,829

(22) Filed: Feb. 1, 2023

(65) Prior Publication Data

US 2023/0176548 A1 Jun. 8, 2023

Related U.S. Application Data

(63) Continuation of application No. PCT/JP2021/032513, filed on Sep. 3, 2021.

(30) Foreign Application Priority Data

Sep. 10, 2020 (JP) ................................ 2020-152293

(51) Int. Cl.
*G05B 19/4155* (2006.01)
*G03F 7/00* (2006.01)

(52) U.S. Cl.
CPC ..... *G05B 19/4155* (2013.01); *G03F 7/70516* (2013.01); *G05B 2219/45028* (2013.01)

(58) Field of Classification Search
CPC ...... G05B 19/4155; G05B 2219/45028; G05B 13/027; G05B 13/02; G03F 7/70516;
(Continued)

(56) References Cited

U.S. PATENT DOCUMENTS 4,602,326 A * 7/1986 Kraus ................ G05B 13/0205 700/39
5,396,415 A * 3/1995 Konar .................. G05B 13/027 706/903

(Continued)

FOREIGN PATENT DOCUMENTS

CN 102346492 A 2/2012
CN 111183397 A 5/2020

(Continued)

OTHER PUBLICATIONS

Asano Tosiya, English translation of WO-2019069649; published Apr. 2019 (Year: 2019).*

(Continued)

*Primary Examiner* — Jonathan Michael Skrzycki
(74) *Attorney, Agent, or Firm* — ROSSI, KIMMS & McDOWELL LLP

(57) ABSTRACT

A control apparatus which generates control signal for controlling a control object, includes a first compensator configured to generate a first signal based on a control deviation of the control object, a corrector configured to generate a correction signal by correcting the control deviation in accordance with an arithmetic expression having an adjustable coefficient, a second compensator configured to generate a second signal by a neural network based on the correction signal, and an arithmetic device configured to
(Continued)

generate the control signal based on the first signal and the second signal.

14 Claims, 13 Drawing Sheets

(58) Field of Classification Search
CPC .... G03F 7/70525; G03F 7/70725; G03F 9/00; H01L 21/68; G06N 20/00
See application file for complete search history.

(56) References Cited

U.S. PATENT DOCUMENTS

| | | | | |
|---|---|---|---|---|
| 9,971,251 | B2 | 5/2018 | Schmitt-Weaver et al. | |
| 2003/0028266 | A1* | 2/2003 | Jacques | G05B 5/01 700/32 |
| 2004/0128918 | A1* | 7/2004 | Yang | G03F 7/70725 52/7 |
| 2016/0170311 | A1* | 6/2016 | Schmitt-Weaver | G03F 7/70516 355/67 |
| 2019/0075617 | A1 | 3/2019 | Tomeba et al. | |
| 2019/0187631 | A1 | 6/2019 | Badgwell et al. | |
| 2020/0233316 | A1 | 7/2020 | Asano et al. | |
| 2021/0341895 | A1* | 11/2021 | Havlena | G06N 3/006 |

FOREIGN PATENT DOCUMENTS

| | | | | |
|---|---|---|---|---|
| EP | 3693798 | A1 | 8/2020 | |
| JP | H05134710 | A | 6/1993 | |
| JP | H07503563 | A | 4/1995 | |
| JP | H0816208 | A | 1/1996 | |
| JP | 2019071405 | A | 5/2019 | |
| JP | 2019071505 | A | 5/2019 | |
| KR | 1020200057050 | A | 5/2020 | |
| TW | 201514638 | A | 4/2015 | |
| WO | 9315448 | A1 | 8/1993 | |
| WO | WO-2019069649 | A1 * | 4/2019 | H01L 21/027 |

OTHER PUBLICATIONS

International Search Report issued in Intl. Appln. No. PCT/JP2021/032513 mailed Oct. 26, 2021. English translation provided.
Extended European search report issued in European Appln. No. 21866683.2, mailed on Sep. 9, 2024.
Office Action issued in Chinese Appln. No. 202180054976.5 mailed Oct. 31, 2025.

* cited by examiner

CONTROL APPARATUS, ADJUSTING METHOD THEREOF, LITHOGRAPHY APPARATUS, AND ARTICLE MANUFACTURING METHOD THAT IMPROVE POSITIONAL ACCURACY OF AN OBJECT

CROSS-REFERENCE TO RELATED APPLICATIONS

This application is a Continuation of International Patent Application No. PCT/JP2021/032513, filed Sep. 3, 2021, which claims the benefit of Japanese Patent Application No. 2020-152293, filed Sep. 10, 2020, both of which are hereby incorporated by reference herein in their entirety.

BACKGROUND OF THE INVENTION

Field of the Invention

The present invention relates to a control apparatus, an adjusting method thereof, a lithography apparatus, and an article manufacturing method.

Background Art

Recently, demands for improving control accuracy are becoming severer, so no required accuracy can be achieved in some cases by using conventional feedback control alone. Therefore, an effort is being made to use a neural network controller in parallel to a conventional controller (Japanese Patent Laid-Open No. H07-503563). Parameters of the neural network controller are adjusted by machine learning, but the controller has a problem concerning reliability. For example, a controller generated by machine learning may perform abnormal output in a situation largely different from a situation given during learning (that is, when the state of a control object has changed or when a disturbance environment has changed). To solve this problem, a technique of installing a limiting unit for limiting output in the output stage of the neural network controller has been proposed (Japanese Patent Laid-Open No. 2019-71505).

When the state of a control object has changed and/or the disturbance environment has changed, it is possible that predetermined neural network parameter values of a conventional control apparatus using a neural network become no longer optimum, and the control accuracy worsens. In this case, the control accuracy can be improved by predetermining the neural network parameter values by relearning. However, the execution of relearning requires a considerable time. Also, a predetermined learning sequence is executed in relearning, so the apparatus cannot produce anything. Therefore, the execution of relearning may decrease the productivity of the apparatus.

SUMMARY OF THE INVENTION

The present invention provides a technique advantageous in improving the tolerance to the state change of a control object and/or the change in disturbance environment.

One aspect of the present invention is related to a control apparatus for generating a control signal for controlling a control object, and the control apparatus comprises a first compensator configured to generate a first signal based on a control deviation of the control object, a corrector configured to generate a correction signal by correcting the control deviation in accordance with an arithmetic expression having an adjustable coefficient, a second compensator configured to generate a second signal by a neural network based on the correction signal, and an arithmetic device configured to generate the control signal based on the first signal and the second signal.

Further features of the present invention will become apparent from the following description of exemplary embodiments with reference to the attached drawings.

DESCRIPTION OF THE EMBODIMENTS

Figure 1:
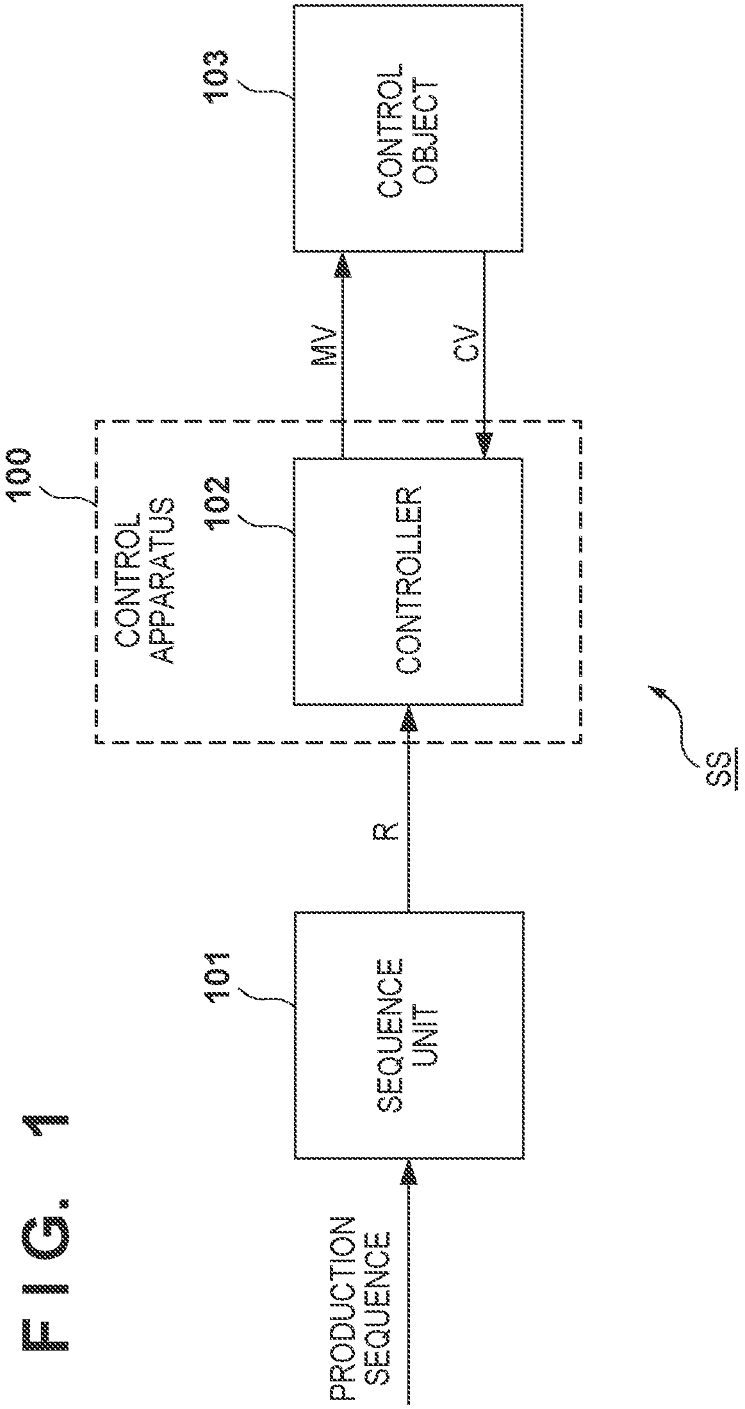
FIG. 1 is a view showing a configuration example of a system of the first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 shows the configuration of a system SS of the first embodiment. The system SS can be applied to, for example, a manufacturing apparatus for manufacturing an article. This manufacturing apparatus can include, for example, a processing apparatus for processing a material or a member of a part forming an article or a part forming a portion of an article. The processing apparatus can be one of, for example, a lithography apparatus for transferring a pattern to a material or a member, a film formation apparatus for forming a film on a material or a member, an apparatus for etching a material or a member, and a heating apparatus for heating a material or a member.

The system SS can include, for example, a sequence unit 101, a control apparatus 100, and a control object 103. The control apparatus 100 can include a controller 102. The control apparatus 100 or the controller 102 can generate a manipulated variable (manipulated variable signal) MV as a control signal for controlling the control object 103. When the system SS is applied to a production system, a production sequence can be provided for the sequence unit 101. The production sequence can define a procedure for production. Based on this production sequence, the sequence unit 101 can generate a target value R for controlling the control object 103 and provide the target value R to the control apparatus 100 or the controller 102.

The control apparatus 100 or the controller 102 can perform feedback control on the control object 103. More specifically, based on a control deviation as the difference between the target value R provided from the sequence unit 101 and a controlled variable CV provided from the control object 103, the control apparatus 100 or the controller 102 can control the control object 103 so that the controlled variable CV of the control object 103 follows the target value R. The control object 103 can have a sensor for detecting the controlled variable CV, and the controlled variable CV detected by the sensor can be provided to the controller 102. Each of the target value R, the manipulated variable MV, and the controlled variable CV can be time-series data that changes its value in accordance with the elapse of time.

Figure 2:
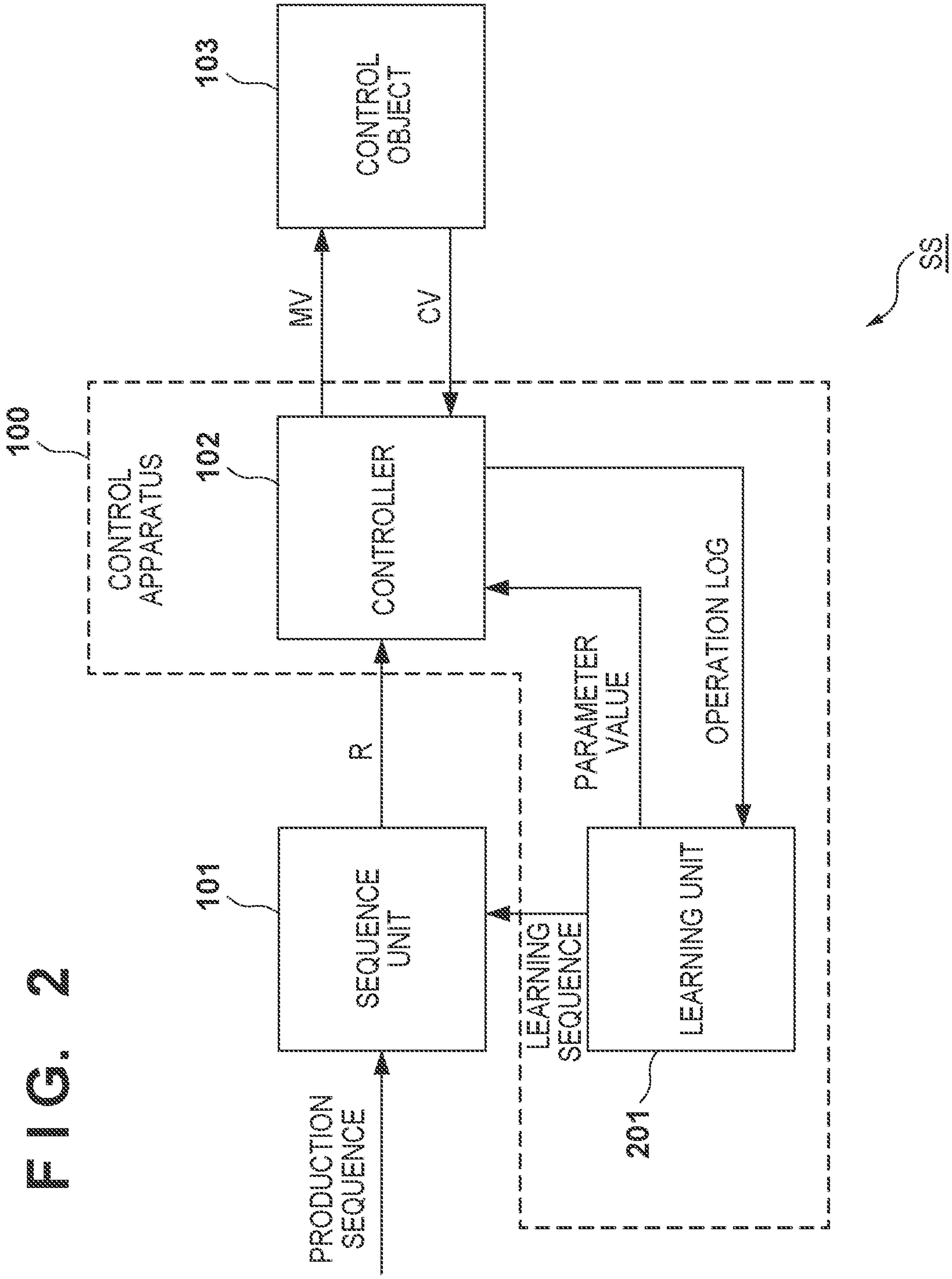
FIG. 2 is a view showing a configuration example of the system of the first embodiment.

As shown in FIG. 2, the system SS can include a learning unit 201. The learning unit 201 can be configured as a part of the control apparatus 100 and can also be configured as an external device of the control apparatus 100. When the learning unit 201 is configured as an external device of the control apparatus 100, the learning unit 201 can be separated from the control apparatus 100 after learning is finished. The learning unit 201 can be so configured as to send a prepared learning sequence to the sequence unit 101. The sequence unit 101 can generate the target value R in accordance with the learning sequence, and provide the target value R to the controller 102.

The controller 102 can generate the manipulated variable MV based on the control deviation as the difference between the target value R generated in accordance with the learning sequence by the sequence unit 101 and provided therefrom and the controlled variable CV provided from the control object 103. The controller 102 has a neural network and can generate the manipulated variable MV by using the neural network. The manipulated variable MV generated by the controller 102 can be provided to the control object 103, and the control object 103 can operate in accordance with the manipulated variable MV. The controlled variable CV as a result of this operation can be provided to the controller 102. The controller 102 can provide the learning unit 201 with an operation log indicating the history of the operation of the controller 102 based on the target value R. Based on this operation log, the learning unit 201 can determine a parameter value of a neural network and set the parameter value in the neural network of the controller 102. The parameter value can be determined by machine learning such as reinforcement learning.

Figure 3:
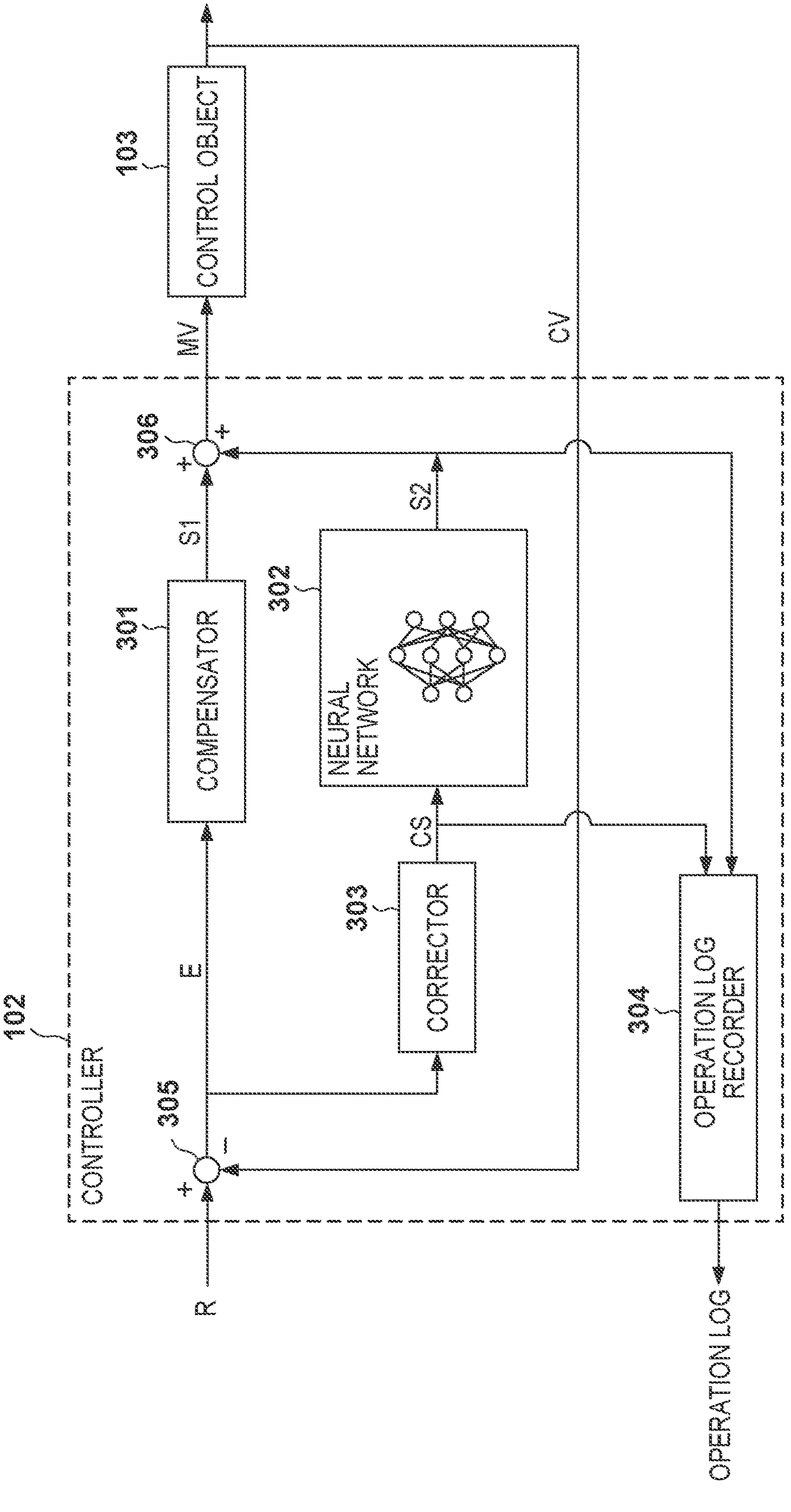
FIG. 3 is a block diagram showing a configuration example of a controller in the system of the first embodiment.

FIG. 3 shows a configuration example of the controller 102. The controller 102 can include a first compensator 301 for generating a first signal S1 based on a control deviation E of the control object 103, and a corrector 303 for generating a correction signal CS by correcting the control deviation E in accordance with an arithmetic expression having an adjustable coefficient. The controller 102 can also include a second compensator 302 for generating a second signal S2 by a neural network based on the correction signal CS, and an arithmetic unit 306 for generating the manipulated variable MV as a control signal based on the first signal S1 and the second signal S2. The manipulated variable MV is the sum of the first and second signals S1 and S2, so the arithmetic unit 306 can be configured by an adder. In another viewpoint, the manipulated variable MV is a signal corrected based on the first and second signals S1 and S2. The controller 102 can include a subtracter 305 for generating the control deviation E as the difference between the target value R and the controlled variable CV.

The controller 102 can further include an operation log recorder 304. The learning unit 201 can be so configured as to determine a parameter value of a neural network of the second compensator 302. For this learning by the learning unit 201, the operation log recorder 304 can record an operation log necessary for the learning by the learning unit 201, and provide the recorded operation log to the learning unit 201. The operation log can be the correction signal CS as input data to the second compensator 302 and the second signal S2 as output data from the second compensator 302, but can also be another data.

Some configuration examples of the corrector 303 will be explained below. The first to fifth configuration examples provide examples of an arithmetic expression to be used by the corrector 303 to generate the correction signal CS based on the control deviation E. The arithmetic expression can be either a monomial or a polynomial.

In the first configuration example, the corrector 303 has a control characteristic represented by an arithmetic expression of equation 1. In this arithmetic expression, x is an input (E) to the corrector 303, y is an output (CS) from the corrector 303, and $K_p$ is an arbitrary coefficient (constant).

$$y = K_p x \tag{1}$$

In the second configuration example, the corrector 303 has a control characteristic represented by an arithmetic expression of equation 2. In this arithmetic expression, x is an input (E) to the corrector 303, y is an output (CS) from the corrector 303, t is the time, and $K_i$ is an arbitrary coefficient (constant). Note that an integral can be performed a plurality of times. The integral can be either definite integral in a given time zone or indefinite integral.

$$y = K_i \int x \, dt \tag{2}$$

In the third configuration example, the corrector 303 has a control characteristic represented by an arithmetic expression of equation 3. In this arithmetic expression, x is an input (E) to the corrector 303, y is an output (CS) from the corrector 303, t is the time, and $K_d$ is an arbitrary coefficient (constant). Note that a differential can be performed a plurality of times.

$$y = K_d \frac{dx}{dt} \tag{3}$$

In the fourth configuration example, the corrector 303 has a control characteristic represented by an arithmetic expression of equation 4. In this arithmetic expression, x is an input (E) to the corrector 303, y is an output (CS) from the corrector 303, and $K_p$, $K_i$, and $K_d$ are arbitrary coefficients (constants). Note that the integral and the differential can be performed a plurality of times.

$$y = K_p x + K_i \int x dt + K_d \frac{dx}{dt} \tag{4}$$

In the fifth configuration example, the corrector 303 has a control characteristic represented by an arithmetic expression of equation 5. In this arithmetic expression, x is an input (E) to the corrector 303, y is an output (CS) from the corrector 303, n is the integral order of a multiple integral, m is a differential order, $K_p$ is an arbitrary coefficient (constant), $K_{i\_n}$ is an arbitrary coefficient (constant) of an n-fold integral, and $K_d$ m is an arbitrary coefficient (constant) of an mth-order differential.

$$y = K_p x + \sum k_{i\_n} \int \dots \int x dt_n + \sum K_{d\_m} \frac{d^m x}{dt^m} \tag{5}$$

Each of the first to fifth configuration examples can be understood as an example in which an arithmetic expression to be used to generate the correction signal CS by the corrector 303 contains at least one of a term proportional to the control deviation E, a term that integrates the control deviation E once or more, and a term that differentiates the control deviation E once or more.

The coefficients (constants) $K_p$, $K_i$, $K_d$, $K_{i\_n}$, and $K_{d\_m}$ of the arithmetic expressions in the first to fifth configuration examples are examples of parameters adjustable by the corrector 303. When the state of the control object 103 has changed and/or the disturbance environment has changed while the system SS is operating, the change or the changes can be controlled by adjusting the values (parameter values) of (the coefficients of) the arithmetic expressions exemplified as the first to fifth configuration examples. The time required to adjust the value of (the coefficient of) the arithmetic expression of the corrector 303 is shorter than the time required for relearning of a neural network. Accordingly, the control accuracy can be maintained without decreasing the productivity of the system SS. That is, it is possible to improve the tolerance to the state change of a control object and/or the change in disturbance environment by using the corrector 303.

Figure 4:
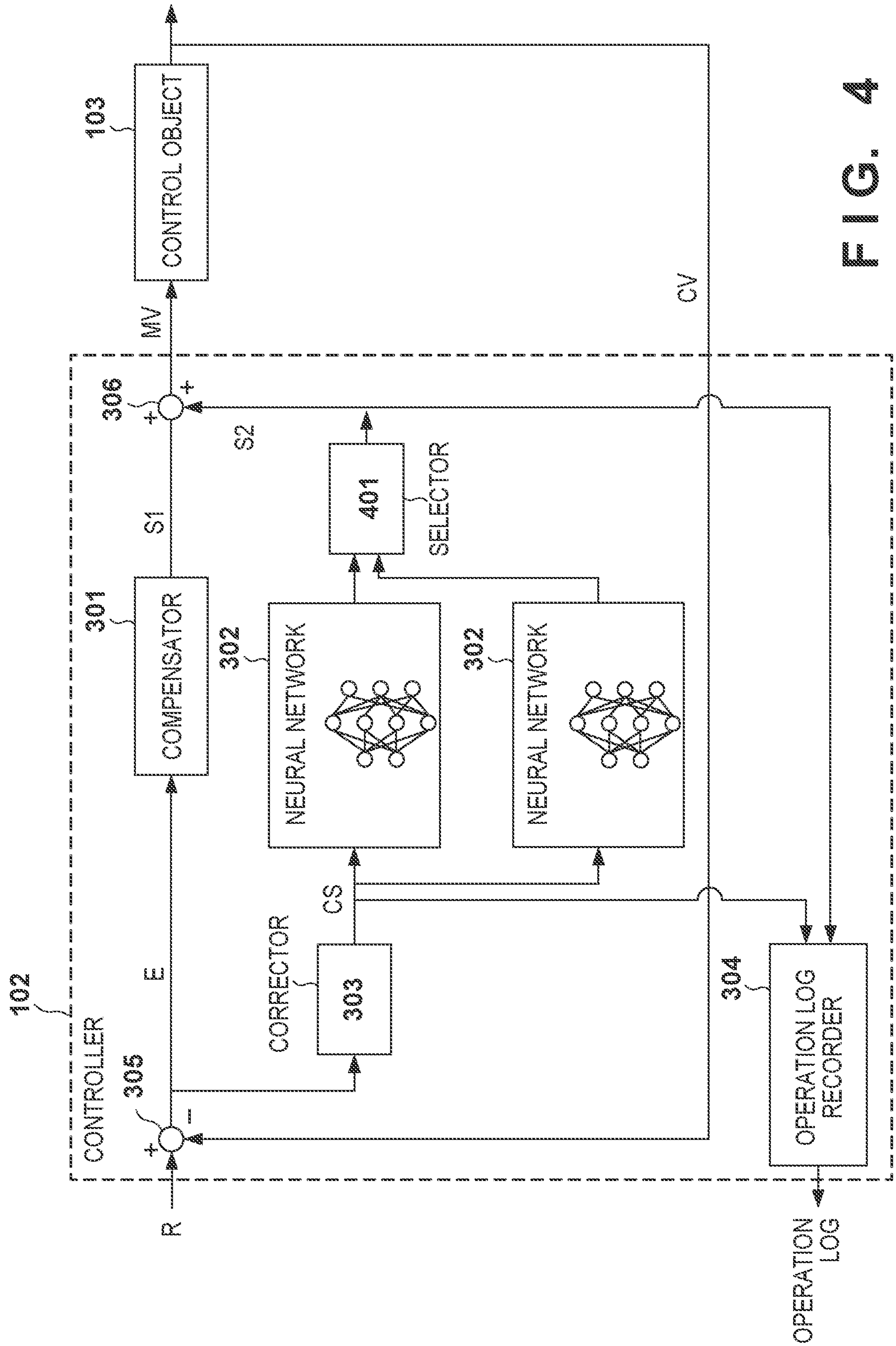
FIG. 4 is a block diagram showing a configuration example of the controller in the system of the first embodiment.

FIG. 4 shows another configuration example of a controller 102. As shown in FIG. 4, the controller 102 can have a plurality of (two or more) neural networks 302. The correction signal CS generated by the corrector 303 can be provided to the plurality of neural networks 302. Alternatively, the correction signal CS generated by the corrector 303 can be provided to a selected neural network 302 of the plurality of neural networks 302. It is possible to select one of the plurality of neural networks 302 by a selector 401 based on the operation pattern of the control object 103, and provide the output from the neural network 302 selected by the selector 401 as the second signal S2 to the arithmetic unit 306. Information indicating the operation pattern to be used to select a neural network by the selector 401 can be provided from the sequence unit 101 to the selector 401.

Parameter values of the plurality of neural networks 302 can be determined in accordance with the operation pattern of the control object 103. For example, when the control object 103 includes a stage and the position of the stage is to be controlled, different neural networks can be used for an operation pattern in an acceleration zone where the stage is accelerated, and for other operation patterns. It is also possible to incorporate two systems SS into an exposure apparatus, control a plate stage (substrate stage) by one system SS, and control a mask stage (original stage) by the other system SS. In this case, different neural networks can be used in the systems SS for an operation pattern in a synchronization zone where the plate stage and the mask stage are synchronously driven, and for other operation patterns.

As described above, when using the plurality of neural networks 302, the use of the corrector 303 can improve the tolerance to the stage change of the control object and/or the change in disturbance environment.

Figure 5:
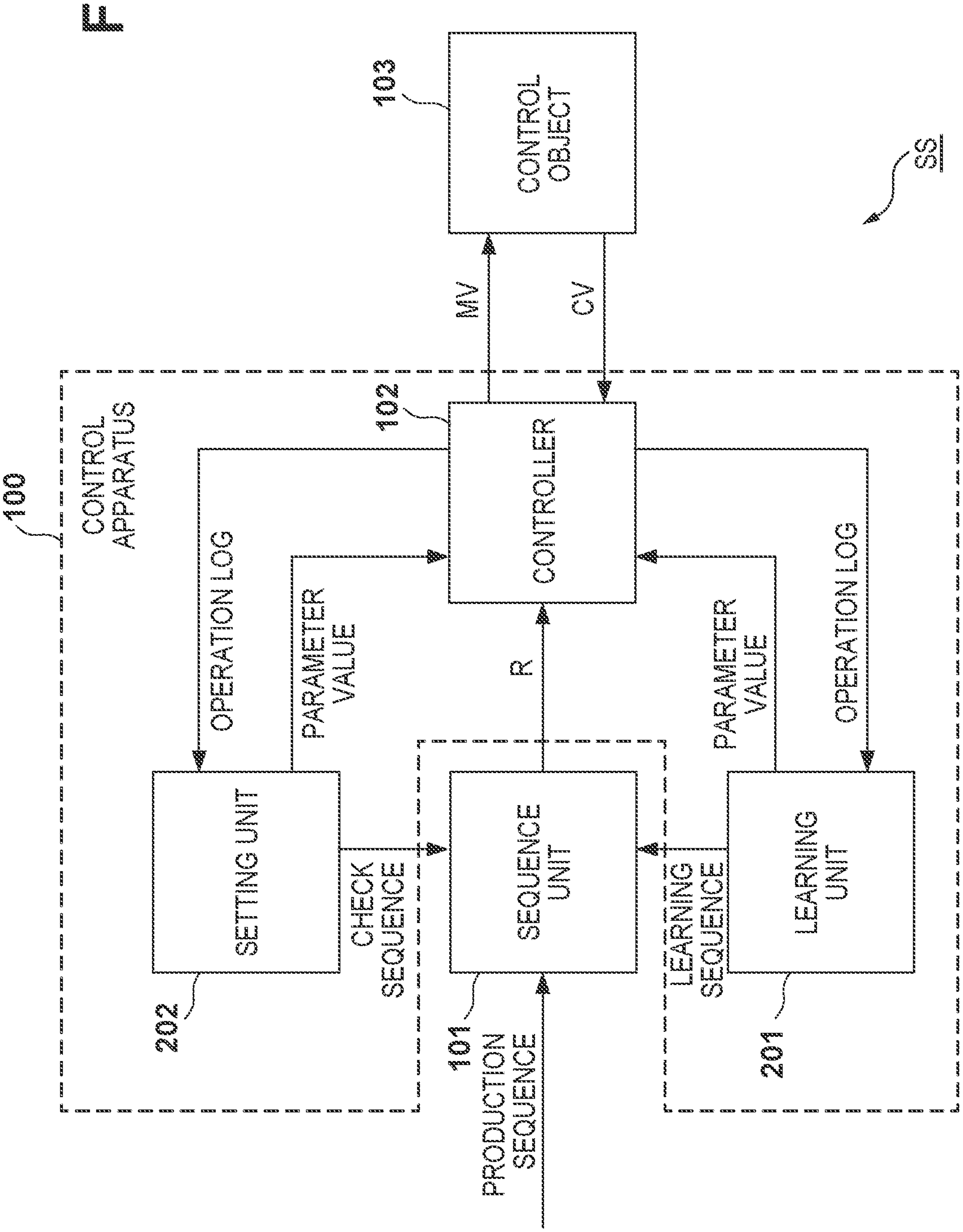
FIG. 5 is a view showing a configuration example of the system of the first embodiment.

As shown in FIG. 5, the control apparatus 100 can include a setting unit 202 for setting the parameter value of the corrector 303. The setting unit 202 can execute an adjusting process of adjusting the parameter value of the corrector 303 and determine the parameter value of the corrector 303 by this adjusting process, and can also determine the parameter value of the corrector 303 based on a command from the user. In the former case, the setting unit 202 can send a check sequence for checking the operation of the controller 102 to the sequence unit 101, and cause the sequence unit 101 to generate the target value R based on this check sequence. Then, the setting unit 202 can acquire an operation log (for example, a control deviation) from the controller 102 that operates based on the target value R, and determine the parameter value of the corrector 303 based on the operation log. The setting unit 202 having the functions as described above can be understood as an adjusting unit for adjusting the parameter value of the corrector 303.

During production in which the sequence unit 101 generates the target value R based on the production sequence, the setting unit 202 can acquire an operation log (for example, a control deviation) from the controller 102, and determine whether to adjust the parameter value of the corrector 303 based on this operation log. It is also possible to install, separately from the setting unit 202, a determination unit for determining whether to adjust the parameter value of the corrector 303 by using the setting unit 202 during production in which the sequence unit 101 generates the target value R based on the production sequence.

Figure 6:
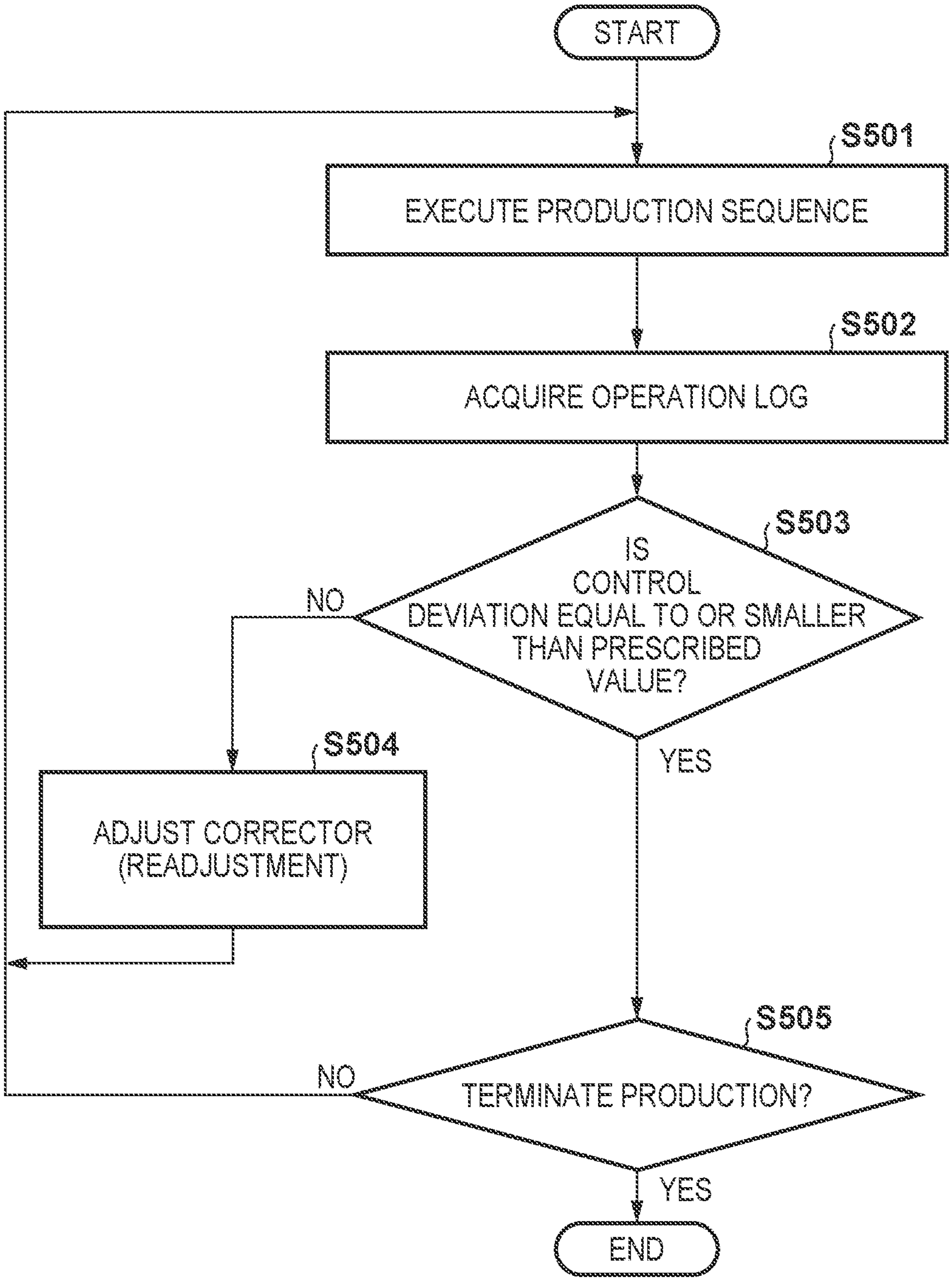
FIG. 6 is a flowchart showing an operation example of a system of the second embodiment when the system is applied to a production apparatus.

FIG. 6 shows an operation example of the system SS of the first embodiment when the system SS is applied to a production apparatus. In step S501, the sequence unit 101 can generate the target value R based on a given production sequence, and provide the target value R to the control apparatus 100 or the controller 102. The control apparatus 100 or the controller 102 can control the control object 103 based on the target value R. In step S502, the setting unit 202 can acquire an operation log (for example, a control deviation) of the controller 102 in step S501. In step S503, the setting unit 202 can determine, based on the operation log acquired in step S502, whether to execute adjustment (or readjustment) of the parameter value of the corrector 303. For example, when the operation log meets a predetermined condition, the setting unit 202 can determine to execute adjustment (or readjustment) of the parameter value of the corrector 303. The predetermined condition is a condition for stopping production, for example, a condition in which the control deviation acquired as the operation log exceeds a prescribed value. If it is determined to execute adjustment (or readjustment) of the parameter value of the corrector 303 by the setting unit 202, the process advances to step S504; if not, the process advances to step S505. In step S504, the setting unit 202 executes adjustment (or readjustment) of the parameter value of the corrector 303. This adjustment is performed in a state in which the parameter value of the second compensator 302 is maintained in the previous state, and the parameter value (coefficient) of the corrector 303 is reset by the adjustment.

In step S505, the sequence unit 101 determines whether to terminate the production following the production sequence. If NO in step S505, the process returns to step S501. If YES in step S501, the production is terminated. In the above processing, even in a state in which the production is to be stopped, it is possible to immediately adjust the parameter value of the corrector 303 and restart the production while minimizing the interruption of the production.

In step S504, the setting unit 202 can send a check sequence to the sequence unit 101, cause the sequence unit 101 to execute the check sequence, and acquire an operation log (for example, a control deviation) in the check sequence from the controller 102. Then, the setting unit 202 can perform frequency analysis on the operation log, determine based on the analysis result a frequency to be improved, and determine the parameter value of the corrector 303 so that a control deviation at the frequency does not exceed a prescribed value. A more practical example of step S504 will be explained in the second embodiment.

Figure 8:
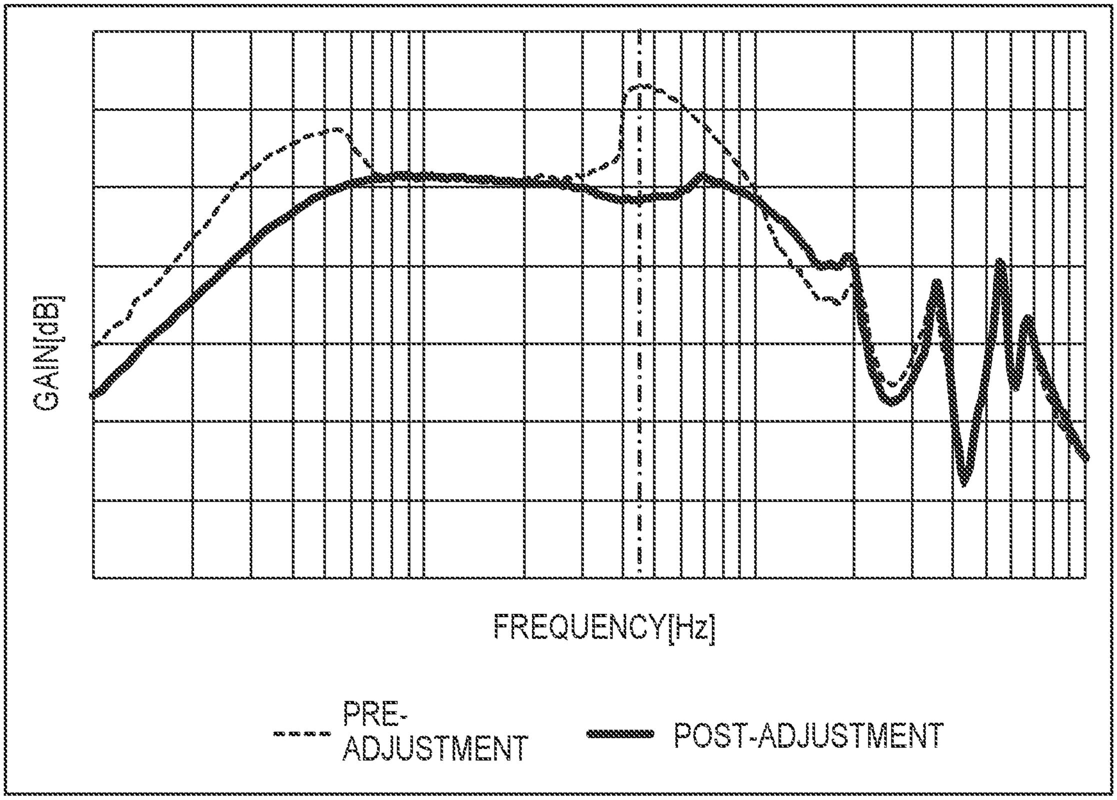
FIG. 8 is a graph showing an example of the disturbance suppression characteristic.

FIG. 8 shows an example of the measurement result of the disturbance suppression characteristic. The disturbance suppression characteristic is a frequency response of the control deviation E when a sine wave is given as the manipulated variable MV. In FIG. 8, the abscissa represents the frequency, and the ordinate represents the gain of the disturbance suppression characteristic. The disturbance suppression characteristic represents the frequency response of the control deviation E when a disturbance is added to the manipulated variable, so a large gain indicates that the effect of suppressing a disturbance is low. On the other hand, a small gain indicates that the effect of suppressing a disturbance is high. In FIG. 8, the broken line shows the disturbance suppression characteristic before adjustment.

When step S504 is executed by determining that a frequency indicated by the alternate long and short dashed line in FIG. 8 is a frequency at which the disturbance suppression characteristic is to be improved, it is possible to obtain, for example, a disturbance suppression characteristic indicated by the solid line. The gain of the disturbance suppression characteristic decreases at the frequency to be improved, showing that the disturbance suppression characteristic has improved.

Figure 9:
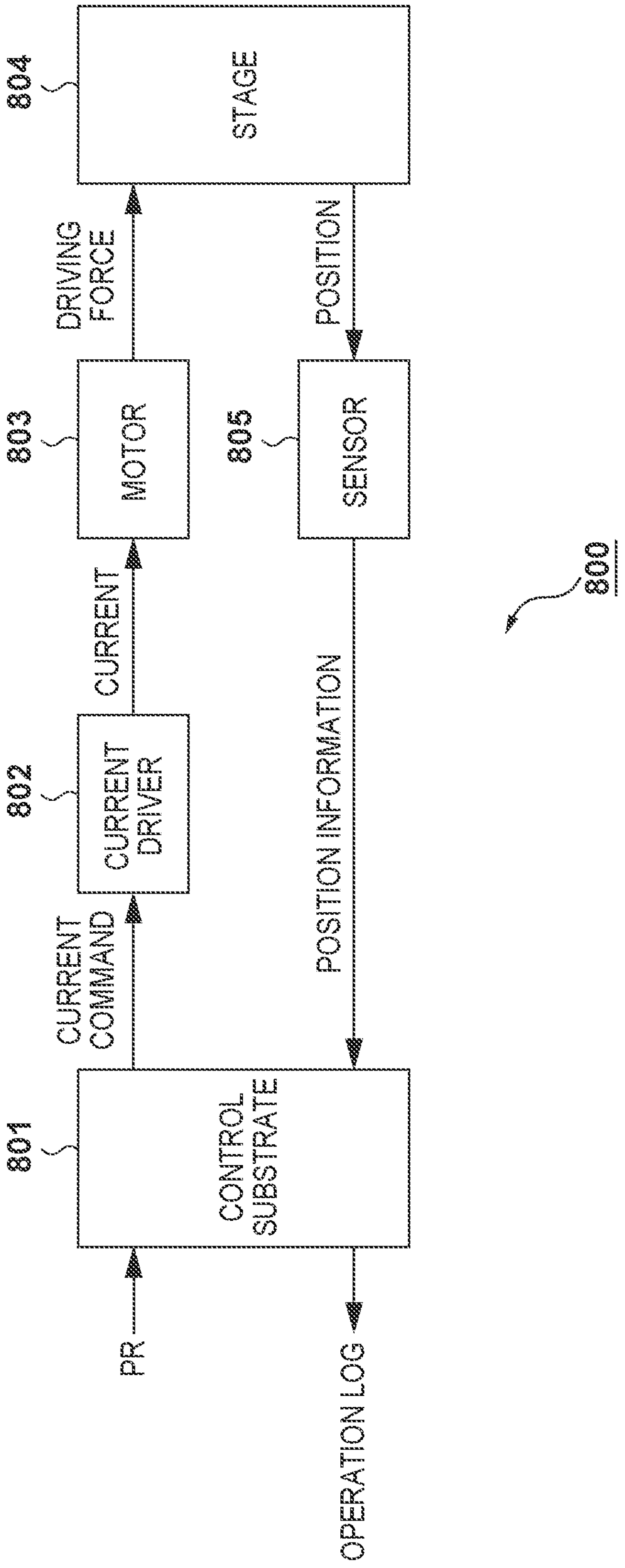
FIG. 9 is a view showing the configuration of a stage control apparatus of the second embodiment.

The second embodiment will be explained below. Items not mentioned in the second embodiment comply with the first embodiment. FIG. 9 shows an example in which the control system SS or the control apparatus 100 of the first embodiment is applied to a stage control apparatus 800. The stage control apparatus 800 is so configured as to control a stage 804. The stage control apparatus 800 can include, for example, a control substrate 801, a current driver 802, a motor 803, the stage 804, and a sensor 805. The control substrate 801 corresponds to the control apparatus 100 or the controller 102 in the system SS of the first embodiment. The current driver 802, the motor 803, the stage 804, and the sensor 805 correspond to the control object 103 in the system SS of the first embodiment. However, the current driver 802 can also be incorporated into the control substrate 801. Although not shown in FIG. 9, the stage control apparatus 800 can include a sequence unit 101, a learning unit 201, and a setting unit 202.

A position target value can be supplied as a target value from the sequence unit 101 to the control substrate 801. Based on this position target value supplied from the sequence unit 101 and position information supplied from the sensor 805, the control substrate 801 can generate a current command as a control signal or as a manipulated variable (manipulated variable command), and supply this current command to the current driver 802. Also, the control substrate 801 can supply an operation log to the sequence unit 101.

The current driver 802 can supply an electric current complying with the current command to the motor 803. The motor 803 can be an actuator that converts the electric current supplied from the current driver 802 into a driving force and drives the stage 804 with this driving force. The stage 804 can hold an object such as a plate or a mask. The sensor 805 can detect the position of the stage 804 and supply the obtained position information to the control substrate 801.

Figure 10:
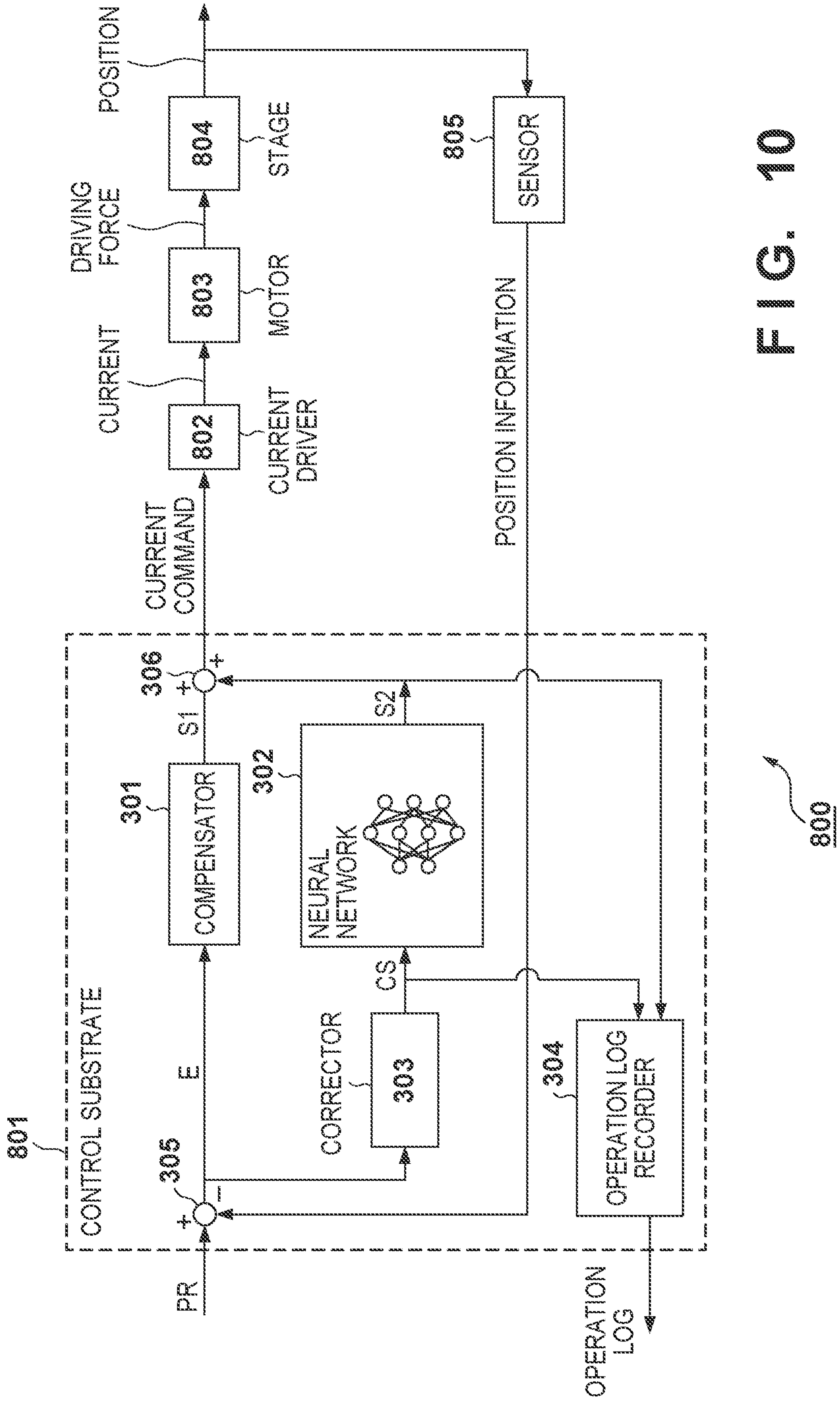
FIG. 10 is a block diagram showing a configuration example of a controller of the stage control apparatus of the second embodiment.

FIG. 10 shows a configuration example of the control substrate 801 as a block diagram. The control substrate 801 can include a first compensator 301 for generating a first signal S1 based on a position control deviation E of the stage 804 as a control object, and a corrector 303 for generating a correction signal CS by correcting the control deviation E in accordance with an arithmetic expression having an adjustable coefficient. The control substrate 801 can also include a second compensator 302 for generating a second signal S2 by a neural network based on the correction signal CS, and an arithmetic unit 306 for generating a current command as a control signal or as a manipulated variable signal based on the first signal S1 and the second signal S2. The control substrate 801 can further include a subtracter 305 for generating the control deviation E as the difference between the position target value PR and the position information.

The stage control apparatus 100 of the second embodiment can include the learning unit 201, and the learning unit 201 can be so configured as to perform learning for determining a parameter value of the neural network of the second compensator 302. For this learning by the learning unit 201, the operation log recorder 304 can record an operation log required for learning by the learning unit 201, and provide the recorded operation log to the learning unit 201. The operation log can be, for example, the correction signal CS as input data to the second compensator 302 and the second signal S2 as output data from the second compensator 302, but can also be another data.

The stage control apparatus 100 of the second embodiment can include the setting unit 202. The setting unit 202 can execute an adjusting process of adjusting a parameter value of the corrector 303, determine a parameter value of the corrector 303 by this adjusting process, and set the determined parameter value, and can also set the parameter value of the corrector 303 based on a command from the user.

An example of the operation of the stage control apparatus 800 of the second embodiment when the stage control apparatus 800 is applied to a production apparatus will be explained with reference to FIG. 6 again. In step S501, the sequence unit 101 can generate a position target value PR based on a given production sequence, and provide the position target value PR to the stage control apparatus 800. The stage control apparatus 800 can control the position of the stage 804 based on the position target value PR. In step S502, the setting unit 202 can acquire an operation log (for example, a control deviation) of the control substrate 801 in step S501. In step S503, the setting unit 202 can determine whether to execute adjustment (or readjustment) of the parameter value of the corrector 303 by the setting unit 202 based on the operation log acquired in step S502. For example, if the operation log meets a predetermined condition, the setting unit 202 can determine to execute adjustment (or readjustment) of the parameter value of the corrector 303. The predetermined condition is a condition for stopping production, for example, a condition in which the maximum value of the position control deviation exceeds a predetermined prescribed value while the stage 804 is driven at a constant velocity. If it is determined to execute adjustment (or readjustment) of the parameter value of the corrector 303 by the setting unit 202, the process advances to step S504; if not, the process advances to step S505. In step 504, the setting unit 202 can execute adjustment (or readjustment) of the parameter value of the corrector 303. In step S505, the sequence unit 101 determines whether to terminate production following the production sequence. If NO in step S505, the process returns to step S501. If YES in step S505, the production is terminated.

Figure 7A:
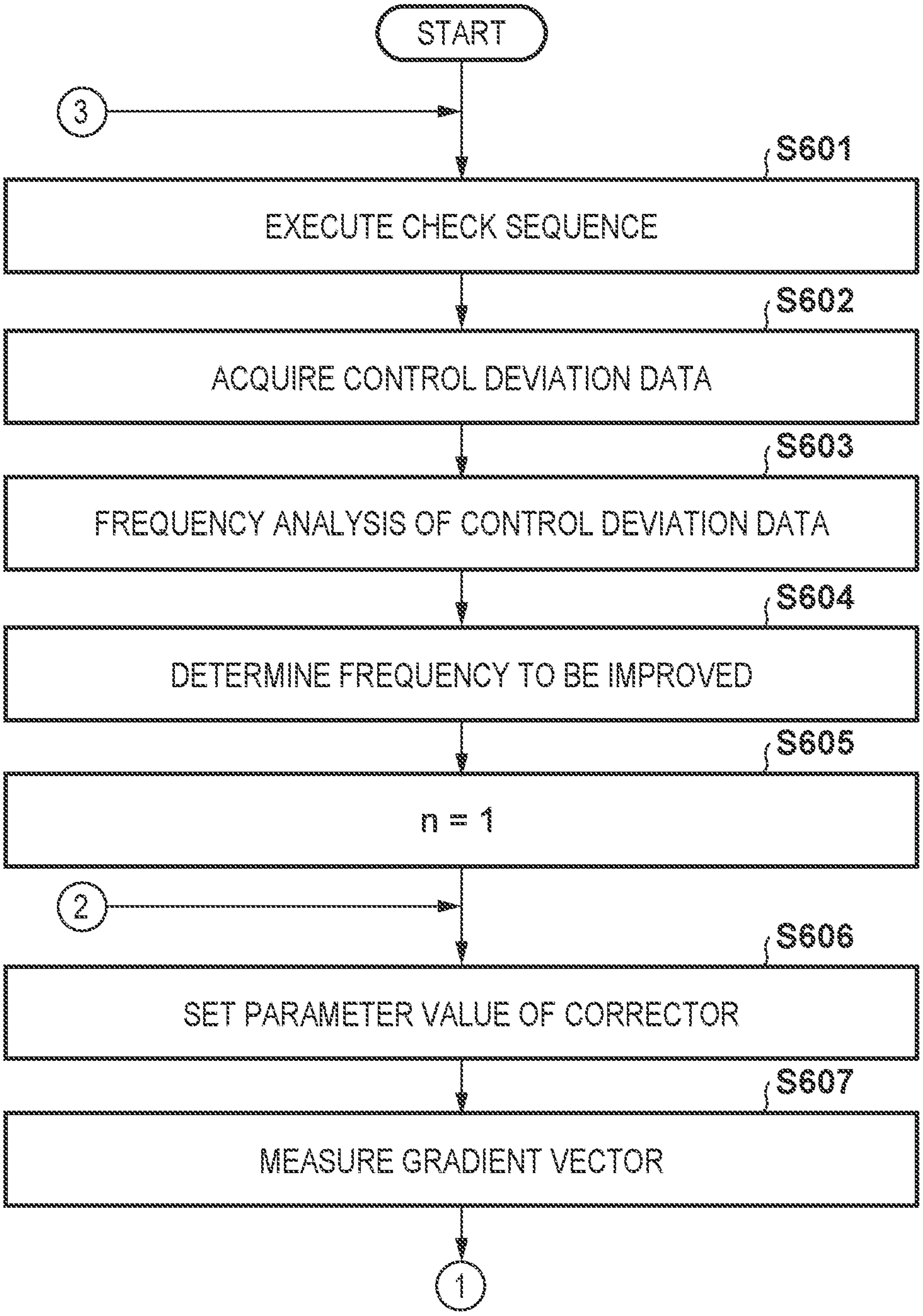
FIG. 7A is a flowchart showing an example of a process of adjusting (or readjusting) a parameter value of a corrector.
Figure 7B:
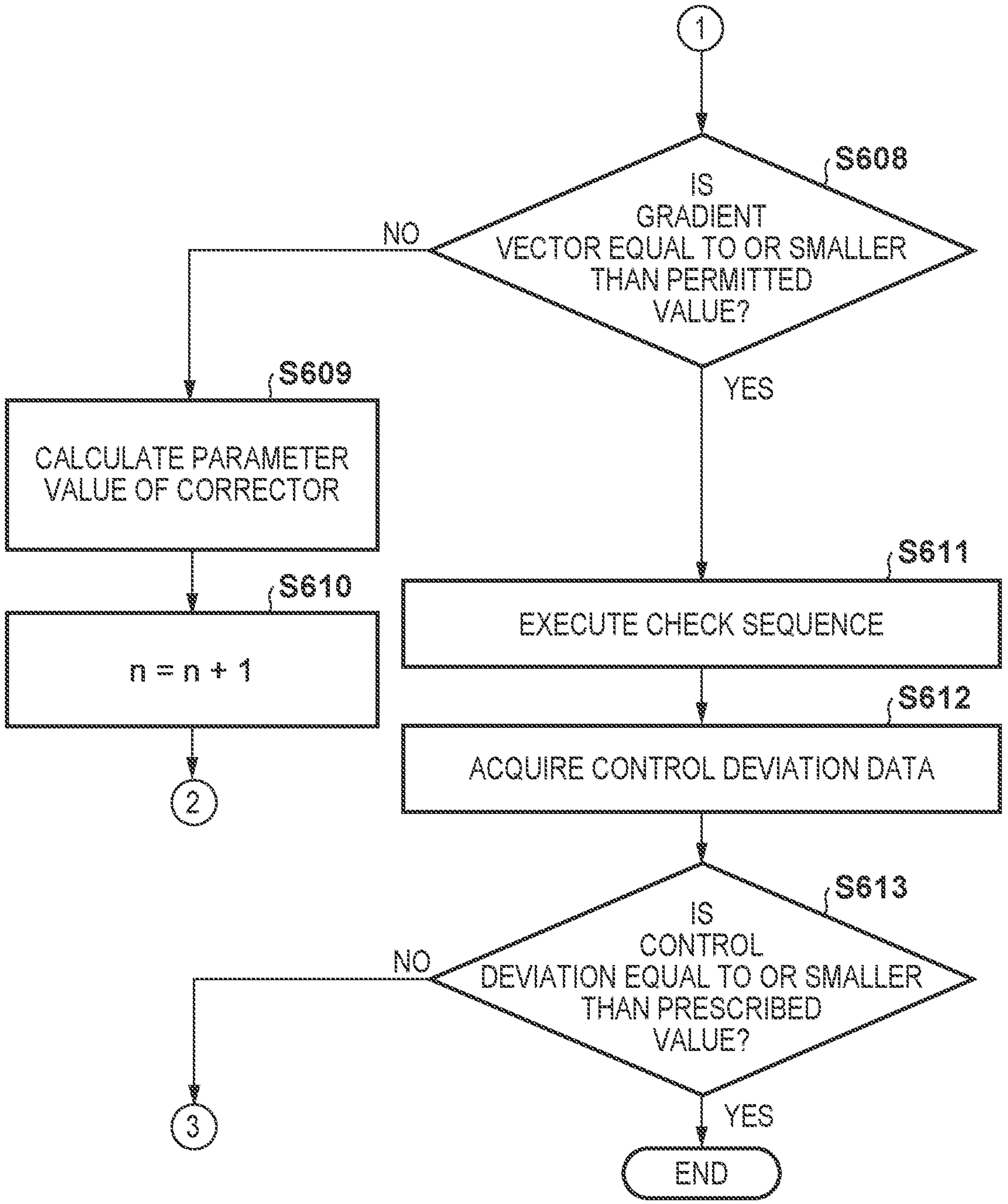
FIG. 7B is a flowchart showing the example of the process of adjusting (or readjusting) a parameter value of the corrector.
Figure 12:
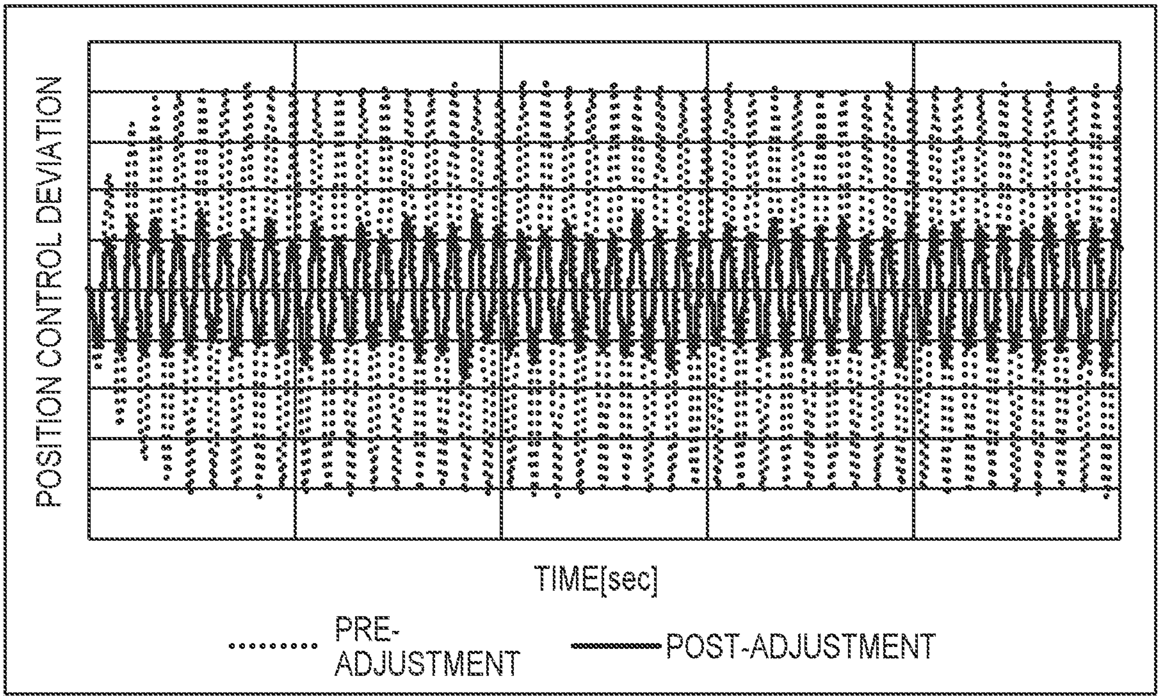
FIG. 12 is a graph showing an example of a position control deviation in the third embodiment.

FIGS. 7A and 7B illustrate a practical example of the process of adjusting (or readjusting) the parameter value of the corrector 303 in step S504. In step S601, the setting unit 202 can send a check sequence for checking the operation of the stage control apparatus 800 to the sequence unit 101, and cause the sequence unit 101 to generate the position target value PR based on this check sequence. In step S602, the setting unit 202 can acquire the position control deviation E as an operation log from the controller 102 that operates based on the position target value PR. FIG. 12 shows an example of the position control deviation. In FIG. 12, the abscissa indicates the time, and the ordinate indicates the position control deviation E. A curve indicated by the dotted line is the position control deviation E before the parameter value of the corrector 303 is adjusted, and shows that the position control accuracy has worsened.

Figure 13:
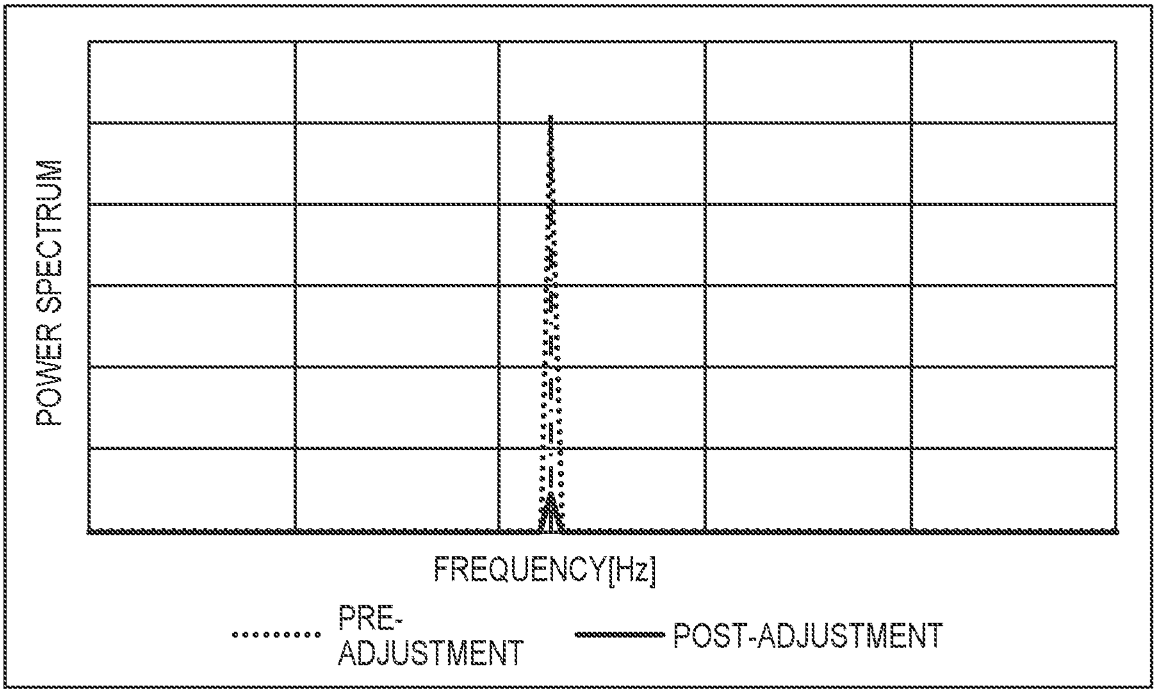
FIG. 13 is a graph showing an example of the result of frequency analysis in the third embodiment.

In step S603, the setting unit 202 can perform frequency analysis on the position control deviation E acquired in step S602. FIG. 13 shows an example of the result of the frequency analysis in step S603. In FIG. 13, the abscissa represents the frequency, and the ordinate represents the power spectrum. The dotted line indicates a frequency showing a maximum spectrum before adjustment. In step S604, the setting unit 202 can determine that the frequency showing a maximum spectrum in the power spectrum is a frequency to be improved.

Steps S605 to S610 indicate a practical example of the adjusting process of adjusting the parameter value of the corrector 303. This example will be explained by using a steepest descent method as the parameter value adjusting method, but another method may also be used. In step S605, the setting unit 202 initializes n to 1. For example, when the arithmetic expression of the corrector 303 is configured by three terms, that is, a first-order integral term, a proportional term, and a first-order differential term, parameters having values to be adjusted are three parameters $K_i$, $K_p$, and $K_d$. Equation 6 below shows a parameter value pp in the nth adjustment.

$$p_n = \begin{bmatrix} K_{i\_n} \\ K_{p\_n} \\ K_{d\_n} \end{bmatrix} \quad (6)$$

In step S606, the setting unit 202 can set an arbitrary initial value for a parameter value $p_1$ in the first adjustment of the parameter value $p_n$. In the nth adjustment, a parameter value $p_n$ to be indicated by equation 8 (to be described later) can be set.

An objective function $J(p_n)$ for adjusting the parameter value $p_n$ can be, for example, the gain of the disturbance suppression characteristic at the frequency determined in step S604. In step S607, the setting unit 202 can measure a gradient vector grad $J(p_n)$ of the objective function $J(p_n)$. The gradient vector grad $J(p_n)$ can be given by equation 7. The gradient vector grad $J(p_n)$ can be measured by changing elements $K_{i-n}$, $K_{p-n}$, and $K_{d-n}$ configuring the parameter value $p_n$ by very small amounts.

$$gradJ(p_n) = \begin{bmatrix} \frac{\partial J(p_n)}{\partial K_i} \\ \frac{\partial J(p_n)}{\partial K_p} \\ \frac{\partial J(p_n)}{\partial K_d} \end{bmatrix} \quad (7)$$

In step S608, the setting unit 202 can determine, as convergence determination of the steepest descent method, whether the value of each element of the gradient vector grad $J(p_n)$ is equal to or smaller than a prescribed value. If the value of each element of the gradient vector grad $J(p_n)$ is equal to or smaller than a prescribed value, the setting unit 202 can terminate the adjustment of the parameter value of the corrector 303. On the other hand, the value of each element of the gradient vector grad $J(p_n)$ exceeds a prescribed value, the setting unit 202 can calculate a parameter value $p_{n+1}$ in step S609. In this step, the parameter value $p_{n+1}$ can be calculated in accordance with equation 8 by using, for example, an arbitrary constant α larger than 0. In step S610, the setting unit 202 adds 1 to the value of n and returns to step S606.

$$p_{n+1} = p_n - \alpha\, grad\, J(p_n) \quad (8)$$

In step S611, the setting unit 202 can send a check sequence for checking the operation of the stage control apparatus 800 to the sequence unit 101, and cause the sequence unit 101 to generate the position target value PR based on the check sequence. In step S612, the setting unit 202 can acquire the position control deviation E as an operation log from the controller 102 that operates based on the position target value PR.

In step S613, the setting unit 202 determines whether the position control deviation E acquired in step S612 is equal to or smaller than a prescribed value. If the position control deviation E has exceeded the prescribed value, the setting unit 202 can return to step S601 and execute the adjustment again. If the position control deviation E is equal to or smaller than the prescribed value, the setting unit 202 can terminate the adjustment.

In the second embodiment, when the state of a control object including the stage 804 has changed and/or a disturbance has changed, this change can be controlled by adjusting the parameter value of the corrector 303. In the example shown in FIG. 12, the position control deviation indicated by the dotted line is reduced to the position control deviation indicated by the solid line, so the control accuracy improves.

In the example indicated by equation 6, the number of parameters of the corrector 303 is only 3, that is, far less than the number of parameters of a general neural network. For example, when using a deep neural network, the number of parameters is 1,545 if the number of orders of an input layer is 5, the number of orders of a hidden layer is 32×2, and the number of orders of an output layer is 8. The time required for adjusting the parameter value of the corrector 303 is shorter than that required for determining the 1,545 parameter values by relearning. This makes it possible to maintain the control accuracy without sacrificing the productivity of the stage control apparatus 800.

Figure 11:
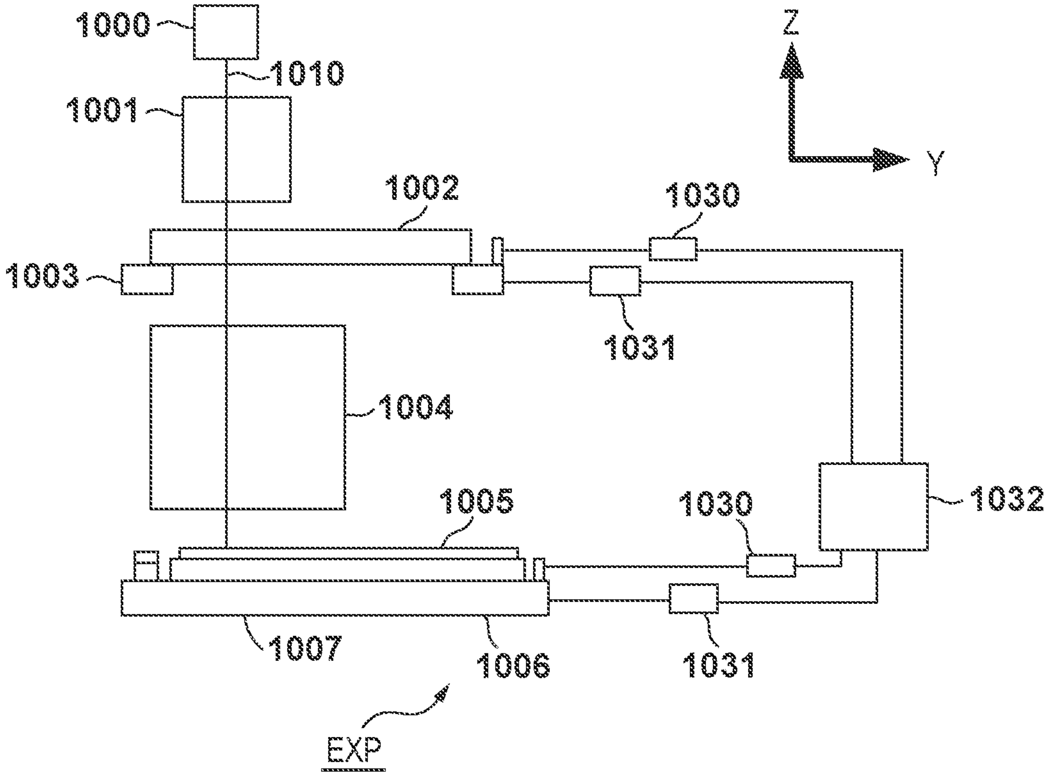
FIG. 11 is a view showing a configuration example of an exposure apparatus of the third embodiment.

FIG. 11 schematically shows a configuration example of an exposure apparatus EXP of the third embodiment. The exposure apparatus EXP can be configured as a scanning exposure apparatus. The exposure apparatus EXP can include, for example, an illumination light source 1000, an illumination optical system 1001, a mask stage 1003, a projection optical system 1004, and a plate stage 1006. The illumination light source 1000 can include a mercury lamp, an excimer laser light source, or an EUV light source, but is not limited to these. Exposure light 1010 from the illumination light source 1000 is shaped into the shape of an irradiation region of the projection optical system 1004 with a uniform illuminance by the illumination optical system 1001. In one example, the exposure light 1010 can be shaped into a rectangle elongated in an X direction as an axis perpendicular to a plane formed by the Y-axis and Z-axis. The exposure light 1010 can be shaped into an arc shape in accordance with the type of the projection optical system 1004. The shaped exposure light 1010 is emitted to a pattern of a mask (original) 1002, and the exposure light 1010 having passed through the pattern of the mask 1002 forms an image of the pattern of the mask 1002 on the surface of a plate (substrate) 1005 via the projection optical system 1004.

The mask 1002 is held by, for example, vacuum suction by the mask stage 1003. The plate 1005 is held by, for example, vacuum suction by a chuck 1007 of the plate stage 1006. The positions of the mask stage 1003 and the plate stage 1006 can be controlled by a multi-axis position control apparatus including a position sensor 1030 such as a laser interferometer, or a laser scale, a driving system 1031 such as a linear motor, and a controller 1032. A position measurement value output from the position sensor 1030 can be provided to the controller 1032. The controller 1032 generates a control signal (manipulated variable signal) based on a position control deviation as the difference between a position target value and the position measurement value, and provides the control signal to the driving system 1031, thereby driving the mask stage 1003 and the plate stage 1006. The pattern of the mask 1002 is transferred to (a photosensitive material on) the plate 1005 by performing scan exposure on the plate 1005 while synchronously driving the mask stage 1003 and the plate stage 1006 in the Y direction.

A case in which the second embodiment is applied to control of the plate stage 1006 will be explained below. Referring to FIG. 9, the control substrate 801 corresponds to the controller 1032, the current driver 802 and the motor 803 correspond to the driving system 1031, the stage 804 corresponds to the plate stage 1006, and the sensor 805 corresponds to the position sensor 1030. The position control deviation of the plate stage 1006 can be reduced by applying a controller having a neural network to control of the plate stage 1006. Consequently, the overlay accuracy or the like can be improved. The parameter value of a neural network can be determined by a predetermined learning sequence. However, if the state of the control object has changed and/or the disturbance environment has changed from the time of learning, the control accuracy of the plate stage 1006 decreases. Even in a case like this, the parameter value of the corrector can be adjusted within a shorter time period than that required for relearning the neural network. As a consequence, the control accuracy can be maintained without sacrificing the productivity of the exposure apparatus.

A case in which the second embodiment is applied to control of the mask stage 1003 will be explained below. Referring to FIG. 9, the control substrate 801 corresponds to the controller 1032, the current driver 802 and the motor 803 correspond to the driving system 1031, the stage 804 corresponds to the mask stage 1003, and the sensor 805 corresponds to the position sensor 1030.

Even when the second embodiment is applied to the mask stage 1003, the position control deviation of the mask stage 1003 can be reduced. Consequently, the overlay accuracy or the like can be improved. The parameter value of a neural network can be determined by a predetermined learning sequence. The parameter value of a neural network can be determined by a predetermined learning sequence. However, if the state of the control object has changed and/or the disturbance environment has changed from the time of learning, the control accuracy of the mask stage 1003 decreases. Even in a case like this, the parameter value of the corrector can be adjusted within a shorter time period than that required for relearning the neural network. As a consequence, the control accuracy can be maintained without sacrificing the productivity of the exposure apparatus.

The second embodiment is applicable not only to control of a stage of an exposure apparatus, but also to control of a stage in other lithography apparatuses such as an imprint apparatus and an electron beam lithography apparatus. Also, the first or second embodiment can be applied to control of a moving part, such as a hand for holding an article, of a conveyor mechanism for conveying an article.

The lithography apparatus as described above can be used to perform an article manufacturing method for manufacturing various articles (for example, a semiconductor IC device, a liquid crystal display device, and MEMS). The article manufacturing method includes a transfer step of transferring a pattern of an original to a substrate by using the abovementioned lithography apparatus, and a processing step of processing the substrate having undergone the transfer step, and obtains an article from the substrate having undergone the processing step. When the lithography apparatus is an exposure apparatus, the transfer step can include an exposure step of exposing a substrate through an original, and a developing step of developing the substrate having undergone the exposure step.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A control apparatus for generating a control signal for controlling a position of a control object, which is one of a substrate or an original having a pattern to be transferred onto the substrate, the control apparatus comprising:

at least one processor or circuit configured to:

generate a first signal using a control deviation of the control object;

set an arithmetic expression that includes an adjustable coefficient;

generate a correction signal by correcting the control deviation in accordance with the arithmetic expression, wherein in generating the correction signal, the at least one processor or circuit is configured to:

perform frequency analysis on the control deviation;

determine a frequency to be improved based on an analysis result of the frequency analysis; and determine a parameter value of the adjustable coefficient of the arithmetic expression so that the control deviation at the determined frequency does not exceed a prescribed value;

generate a second signal by a neural network based on the correction signal;

generate the control signal to control the position of the control object based on the first signal and the second signal;

reset the parameter value of the adjustable coefficient of the arithmetic expression based on a disturbance suppression characteristic, which represents a frequency response of the control deviation resulting from adding a disturbance to the control signal, to decrease a gain of the disturbance suppression characteristic at the determined frequency to be improved.

2. The control apparatus according to claim 1, wherein the arithmetic expression contains a term proportional to the control deviation.

3. The control apparatus according to claim 1, wherein the arithmetic expression contains a term that integrates the control deviation not less than once.

4. The control apparatus according to claim 1, wherein the arithmetic expression contains a term that differentiates the control deviation not less than once.

5. The control apparatus according to claim 1, wherein the arithmetic expression contains at least one of a term proportional to the control deviation, a term that integrates the control deviation not less than once, or a term that differentiates the control deviation not less than once.

6. The control apparatus according to claim 1, wherein the at least one processor or circuit resets the parameter value of the adjustable coefficient of the arithmetic expression in a case where a predetermined condition is met.

7. The control apparatus according to claim 6, wherein the predetermined condition includes the control deviation exceeding a prescribed value.

8. The control apparatus according to claim 1, wherein in a case where a predetermined condition is met and a predetermined parameter value of the neural network is maintained in a previous state, the at least one processor or circuit resets the parameter value of the adjustable coefficient of the arithmetic expression.

9. The control apparatus according to claim 8, wherein the predetermined condition includes the control deviation exceeding a prescribed value.

10. The control apparatus according to claim 1, the at least one processor or circuit includes a learning model configured to determine a parameter value of the neural network by machine learning.

11. The control apparatus according to claim 1, wherein a sine wave as the disturbance is added to the control signal.

12. A lithography apparatus for transferring a pattern of an original to a substrate, the lithography apparatus comprising:

a control apparatus for generating a control signal for controlling a position of a control object, which is one of the substrate or the original, the control apparatus comprising at least one processor or circuit configured to:

generate a first signal using a control deviation of the control object;

set an arithmetic expression that includes an adjustable coefficient;

generate a correction signal by correcting the control deviation in accordance with the arithmetic expression, wherein in generating the correction signal, the at least one processor or circuit is configured to:

perform frequency analysis on the control deviation;

determine a frequency to be improved based on an analysis result of the frequency analysis; and determine a parameter value of the adjustable coefficient of the arithmetic expression so that the control deviation at the determined frequency does not exceed a prescribed value;

generate a second signal by a neural network based on the correction signal;

generate the control signal to control the position of the control object based on the first signal and the second signal;

reset the parameter value of the adjustable coefficient of the arithmetic expression based on a disturbance suppression characteristic, which represents a frequency response of the control deviation resulting from adding a disturbance to the control signal, to decrease a gain of the disturbance suppression characteristic at the determined frequency to be improved.

13. An article manufacturing method comprising:

a transfer step of transferring a pattern of an original to a substrate using the lithography apparatus according to claim 12;

a processing step of processing the substrate having undergone the transfer step; and obtaining an article from the substrate having undergone the processing step.

14. The lithography apparatus according to claim 12, wherein a sine wave as the disturbance is added to the control signal.

* * * * *